United States Patent [19]

Wu

[11] Patent Number: 5,600,155

[45] Date of Patent: Feb. 4, 1997

[54] ARRAY WITH METAL SCAN LINES CONTROLLING SEMICONDUCTOR GATE LINES

[75] Inventor: I-Wei Wu, Los Altos, Calif.

[73] Assignee: Xerox Corporation, Stamford, Conn.

[21] Appl. No.: 572,357

[22] Filed: Dec. 14, 1995

Related U.S. Application Data

[63] Continuation of Ser. No. 368,123, Jan. 3, 1995, abandoned.

[51] Int. Cl.$^6$ .......................... H01L 29/04; G02F 1/1343
[52] U.S. Cl. ................ 257/72; 257/81; 257/532; 257/749; 257/750; 257/754; 257/765; 257/773
[58] Field of Search ................ 257/72, 81, 532, 257/749, 750, 754, 765, 773; 359/59

[56] References Cited

U.S. PATENT DOCUMENTS

| | | | |
|---|---|---|---|
| 5,042,916 | 8/1991 | Ukai et al. | 359/59 |
| 5,339,181 | 8/1994 | Kim et al. | 359/59 |
| 5,367,392 | 11/1994 | Janai | 257/72 |
| 5,412,493 | 5/1995 | Kunii et al. | 359/59 |
| 5,414,547 | 5/1995 | Matsuo et al. | 359/67 |
| 5,424,857 | 6/1995 | Aoki et al. | 359/59 |
| 5,459,596 | 10/1995 | Ueda et al. | 359/59 |
| 5,491,347 | 2/1996 | Allen et al. | 257/59 |

OTHER PUBLICATIONS

Lewis, A., and Wu, I–W., "Polysilicon TFTs for Active Matrix Liquid Crystal Displays," *IEICE Transactions*, vol. J76-C-11, No. 5, May 1993, pp. 211–226.

Wu, I–W., "High-definition displays and technology trends in TFT–LCDs," *Journal of the SID*, vol. 2, No. 1, 1994, pp. 1–14.

Wu, I–W., "Polycrystalline Silicon Thin Film Transistors for Liquid Crystal Displays," *Solid State Phenomena*, vol. 37–38, 1994, pp. 553–564.

Wu, I–W., Stubel, S. Tsai, C. C., Yao, W., Lewis, A., Fulks, R., Chiang, A., and Thompson, M., "Processing and Device Performance of Low–Temperature CMOS Poly–TFTs on 18.4–in.–Diagonal Substrates for AMLCD Application," *SID 92 Digest*, 1992, pp. 615–618.

Martin, R., Chuang, T., Steemers, H., Allen, R., Fulks, R., Stuber, S., Lee, D., Young, M., Ho, J., Nguyen, M., Meuli, W., Fiske, T., Bruce, R., Thompson, M., Tilton, M., and Silverstein, L. D., "P–70: A 6.3–Mpixel AMLCD," *SID 93 Digest*, 1993, pp. 704–707.

*Primary Examiner*—Edward Wojciechowicz

[57] ABSTRACT

Array circuitry formed at the surface of a substrate includes M scan lines that cross N data lines. The array circuitry also includes cell circuitry connected to the mth scan line and the nth data line. The cell circuitry includes a component with a data lead for receiving signals from or providing signals to the nth data line. The cell circuitry also includes connecting circuitry with first and second semiconductor lines. The first semiconductor line has a channel between the nth data line and the data lead of the component. The second semiconductor line is connected to the mth scan line and crosses the first semiconductor line at the channel. Because the second semiconductor line is conductive, signals on the mth scan line control conductivity of the channel. The semiconductor lines can be polysilicon, and the scan lines can be aluminum. The component can include a capacitive element with one electrode under the (m+1)th scan line, part of which forms the other electrode of the capacitor. The channel can be under the nth data line, leaving the cell area free. The component can also include a light transmissive cell electrode in the cell area, and the array circuitry can be used in a display, with liquid crystal material positioned along the cell electrode. The display can also include peripheral circuitry outside the boundary of the array circuitry, connected to the scan lines and data lines.

23 Claims, 8 Drawing Sheets

ARRAY WITH METAL SCAN LINES CONTROLLING SEMICONDUCTOR GATE LINES

This is a continuation of application Ser. No. 08/368,123, filed Jan. 3, 1995, now abandoned.

BACKGROUND OF THE INVENTION

The present invention relates to circuitry formed on substrates. More specifically, the present invention relates to arrays.

Lewis, A., and Wu, I-W., "Polysilicon TFTs for Active Matrix Liquid Crystal Displays," *IEICE TRANSACTIONS*, Vol. J76-C-II, No. 5, May 1993, pp. 211–226, describe fabrication of polysilicon (poly-Si) thin film transistors (TFTs) and poly-Si active matrix liquid crystal display (AMLCD) pixel designs. Section 2.3 describes process flow and device architectures in relation to FIG. 2, which shows TFT device cross-sections. Section 2.6 describes gate materials, indicating that poly-Si gate electrodes have been widely used, but that gate line resistance is difficult to reduce. Cr, ITO, or PtSi are alternatives, and the use of a thin aluminum layer over a conventional poly-Si gate can reduce effective gate line resistance. FIG. 10 shows a schematic of typical AMLCD pixel circuitry, and section 4 discusses poly-Si TFT AMLCD pixel design issues. Of techniques to reduce leakage, the use of multiple gates in a TFT is the simplest; FIG. 11 illustrates the transfer characteristics of TFTs with 1, 2, 4, and 8 gates, all with the same total gate length. Section 5 describes peripheral drive circuits integrated on a glass or quartz substrate with an active matrix, which is the main advantage of poly-Si TFTs over amorphous devices for AMLCDs.

Wu, I-W., "High-definition displays and technology trends in TFT-LCDs," *Journal of the SID*, Vol. 2, No. 1, 1994, pp. 1–14, describes various liquid crystal displays (LCDs), focusing on AMLCDs with TFTs. Section 3 on page 5 compares amorphous silicon (a-Si) TFT-AMLCDs with poly-Si TFT-AMLCDs. FIGS. 2–5 show general features of conventional TFT-AMLCDs. As described in relation to FIG. 3, TFTs act as switches controlled by gate electrodes, connecting data lines to pixel electrodes. As explained at page 6 last paragraph-page 7 first paragraph in relation to FIGS. 4 and 5, a storage capacitor $C_{st}$ helps maintain pixel voltage during a frame time. An electrode of $C_{st}$ can be connected either to a previous gate line or to an independent conductive line to which an appropriate dc voltage is applied; a low-resistance gate-line is desired to minimize adverse effects of RC delay. Section 5 on page 8 describes a-Si AMLCDs in which the gate bus-line material is MoTa alloy, Cr, or low-resistivity Al film. Section 5 also describes self-alignment fabrication of a-Si TFTs, and discusses the relationship between aperture ratio and gate bus-line sheet resistivity, mentioning that an aluminum gate-line is popular. FIG. 11 shows a schematic cross section of a poly-Si TFT AMLCD, described in section 7. Section 7 mentions that poly-Si TFTs allow fabrication of driver circuits and a TFT cell array on the same glass substrate. FIG. 12 shows a double-gate poly-Si TFT to reduce leakage current.

SUMMARY OF THE INVENTION

The invention addresses problems that affect arrays of circuitry formed on substrates.

A two-dimensional (2D) array, for example, can include two sets of conductive lines extending in perpendicular directions, as illustrated by FIG. 3 of the Wu article described above. Each line extending in one direction can provide signals to a column of the array; each line extending in another direction can provide signals to a row of the array.

Conventionally, each row-column position in a 2D array includes circuitry, sometimes called a "cell," that responds to or provides signals on the lines for the cell's row and column combination. Through one set of parallel lines, illustratively called "data lines," each cell receives or provides signals that determine or indicate its state. Through the other set of parallel lines, illustratively called "scan lines," each cell along a scan line receives a signal that enables the cell to receive signals from or to provide signals to its data line. The area of each cell that is bounded by data lines and scan lines, referred to herein as the "cell area," can serve as a transducer, providing or receiving signals to or from sources outside the array.

In conventional arrays, each scan line provides a periodic scan signal that enables a component in each cell connected to the scan line to receive a signal from or provide a signal to its data line during a brief time interval of each cycle. Therefore, tight synchronization of the scan signals with signals on the data lines is critical to successful array operation. Also, the scan signals must maintain high quality transitions across an array. If a scan line has high resistance, its propagation delay is long, which causes signal distortion, preventing accurate signal synchronization and causing inaccurate loading or extraction of data.

Some conventional techniques address the scan line resistance problem by using metal scan lines. But each cell's circuitry conventionally includes a semiconductor channel, and the conductivity of the channel is conventionally controlled by the scan signals, also referred to as "gate signals" by analogy to the gate of a transistor. Therefore, a metal scan line conventionally extends over the semiconductor channel, forming a metal gate transistor. It is well known, however, that a metal gate transistor has performance inferior to a poly-Si gate transistor.

Metal gates also cause problems with fabrication processes such as ion implantation and hydrogenation and problems with design such as line width control for scaling. Such fabrication problems are especially serious for poly-Si TFTs: Hydrogenation to passivate defects in a poly-Si channel affects poly-Si differently than metal. Also, self-aligned ion implantation requires a shrunken metal line, leading to line width control problems, especially for high density displays.

Some conventional techniques use poly-Si scan lines in poly-Si TFT arrays, providing excellent gate oxide integrity in each TFT because the oxide/semiconductor interface between the gate and insulator layers is stable due to compatibility of materials. This avoids fabrication problems but increases scan line resistance, precluding sufficiently large array sizes or sufficiently high densities for many applications. To reduce poly-Si scan line resistance, it has been proposed to provide an aluminum shunt, since the resistivity of doped aluminum is as low as 0.3 ohms/square or less while that of poly-Si is 30–50 ohms/square. But hydrogenation to passivate channel defects would also degrade the shunted scan line due to atomic mixing at the interface between metal and poly-Si and can degrade channel properties such as by causing higher leakage.

The invention provides a more elegant solution to the scan line resistance problem, a solution that also avoids fabrication problems. The invention is based on the discovery of a technique that preserves the advantages of a metal scan line and also obtains the advantages of a poly-Si gate line. The technique provides a metal scan line and a semiconductor line connected to the scan line. The semiconductor line crosses a channel and is conductive so that signals on the scan line control conductivity of the channel.

The technique can be implemented in an array that includes a substrate and array circuitry formed at a surface of the substrate. The array circuitry includes M scan lines extending approximately in a first direction and N data lines extending approximately in a second direction different than the first. For each value of m from 1 through M and for each value of n from 1 through N, the array circuitry includes a crossing region in which the mth scan line and the nth data line cross.

Cell circuitry for at least one of the crossing regions includes a component that has a data lead for receiving signals from or providing signals to the nth data line. The cell circuitry also includes connecting circuitry for electrically connecting the data lead to the nth data line under control of the mth scan line, and the mth scan line includes metal.

The connecting circuitry includes a first semiconductor line connected between the nth data line and the data lead and a second semiconductor line connected to the mth scan line. The second semiconductor line crosses the first semiconductor line at a channel in the first semiconductor line. The second semiconductor line is conductive so that signals on the mth scan line control conductivity of the channel.

A cell's component can, for example, include a capacitive element formed by a first electrode, a second electrode, and an insulating layer between the electrodes. The first electrode is part of the (m+1)th scan line. The second electrode is between the (m+1)th scan line and the substrate. The first electrode extends between crossing regions in which the nth and (n+1)th data lines cross the (m+1)th scan line. The second electrode and first electrode can be of the same width, with their edges aligned.

The technique could be implemented in poly-Si or a-Si circuitry formed on any appropriate substrate. For example, thin-film circuitry could be formed on an insulating substrate. The scan lines and data lines could be aluminum. The first and second semiconductor lines could each include polysilicon, separated from each other by an insulating layer such as silicon dioxide.

A cell's component can also include a cell electrode in the area bounded by the mth and (m+1)th scan lines and the nth and (n+1)th data lines. The cell electrode can be light transmissive, and the array can be part of a display in which the invention is implemented. The display can include peripheral circuitry around the boundary of the array but on the same substrate. The peripheral circuitry can include scan circuitry connected to the scan lines and data circuitry connected to the data lines.

The channel in the first semiconductor line can be within the edges of the nth data line, and substantially all of the first semiconductor line can be between the nth data line and the substrate. Substantially all of the second semiconductor line can also be within the edges of the nth data line, connected to the mth scan line in the crossing region.

To reduce leakage current, the first semiconductor line can include a second channel crossed by the second semiconductor line.

To improve scan line conductivity, the scan line's cross section can be substantially uniform across the array.

The technique described above is advantageous because it provides a metal scan line that can have very low resistance, and therefore very low signal delay and low signal distortion. Because the scan line need not be modified to form a gate, it can be a straight, uniform, continuous metal line, with no kink or other modification that would reduce conductivity.

The technique is also advantageous because it provides a channel that is controlled by a semiconductor line rather than a metal line. Because the scan line can be spaced apart from the channel region, hydrogenation and other processes that relate to poly-Si TFT fabrication, such as ion implantation to form self-aligned source and drain, do not cause interaction between metal from the scan line and the channel, so that the technique can be used in a poly-Si TFT array.

The technique is also advantageous because it permits very efficient use of cell area. As described above, each cell's circuitry can include one or two channels between the edges of the cell's data line, with a semiconductor gate line that connects to the cell's scan line in the region where the scan line crosses the data line. As a result, the channels and the gate line do not occupy cell area.

The technique is especially advantageous for arrays in which a cell includes a storage capacitor. As illustrated in FIGS. 4 and 5 of the Wu article, each cell of a 2D array can include a capacitor to maintain a voltage within the cell for an appropriate storage time. In an LCD array or a liquid crystal light valve (LCLV) array, for example, the capacitor can hold a voltage that controls orientation of adjacent liquid crystal material. In a sensor array, on the other hand, the capacitor can hold a voltage that indicates a quantity of energy received by a sensor for the cell. Similarly, in an energy emitting array, the capacitor can hold a voltage that indicates a quantity of energy to be emitted by an emitter for the cell.

One advantage is that the technique simplifies fabrication of a capacitor under a scan line, with a part of the scan line forming a first electrode and with a second electrode formed in a semiconductor layer between the scan line and the substrate. Conventionally, capacitor fabrication requires an additional masking operation to select the capacitor's electrode area for doping while shielding semiconductor channels from being doped. This requires a tradeoff, however, between the level of capacitor implant doping necessary to prevent voltage dependent capacitance and the damage to the Si/SiO$_2$ interface from stripping implant doped photoresist. It may be impossible to find a satisfactory tradeoff in some cases, such as where the semiconductor layer becomes too thin, and so forth. It is also necessary to extend the second electrode beyond the edges of the scan line to provide regions that receive the additional implant, to have a more uniform capacitive property along the length of the capacitor.

The technique permits fabrication of the capacitor in the same way as source/drain regions, without an additional masking operation and an additional implantation operation. Therefore, the capacitor is heavily doped, ensuring that capacitance is not voltage dependent. Also, the second electrode need not extend beyond the edges of the scan line, but can have edges aligned with the scan line's edges. Further, the second electrodes of adjacent cells need only be separated by the minimum spacing necessary for isolation without coupling, approximately 1 μm in a wafer-sized array and approximately 2 or 3 μm in a large area array. In other words, the second electrodes can extend as far as possible into the crossing regions, maximizing capacitor area. As a result of its maximized area, the capacitor need not occupy any part of the cell area bounded by the scan lines and data lines.

Because the second electrodes are very thin semiconductor layers and are separated by small spacings, a metal scan line formed over them can have a cross section that is nearly uniform across the array, with the same width and thickness at all points along its length. Therefore, conductivity of the scan line is also maximized.

As a result of maximizing capacitor area under the scan line, the technique permits greater useful area and greater cell density without sacrificing cell area. Therefore, the technique is especially advantageous in light transmissive, sensing, or emitting applications, such as displays, light valves, and sensors. Furthermore, when implemented with poly-Si TFTs, the technique permits integration of peripheral circuitry around the outer boundary of the array on the same substrate, providing driving or sensing circuitry for the scan lines and data lines.

The following description, the drawings, and the claims further set forth these and other aspects, objects, features, and advantages of the invention.

DETAILED DESCRIPTION

A. Conceptual Framework

Figure 1:
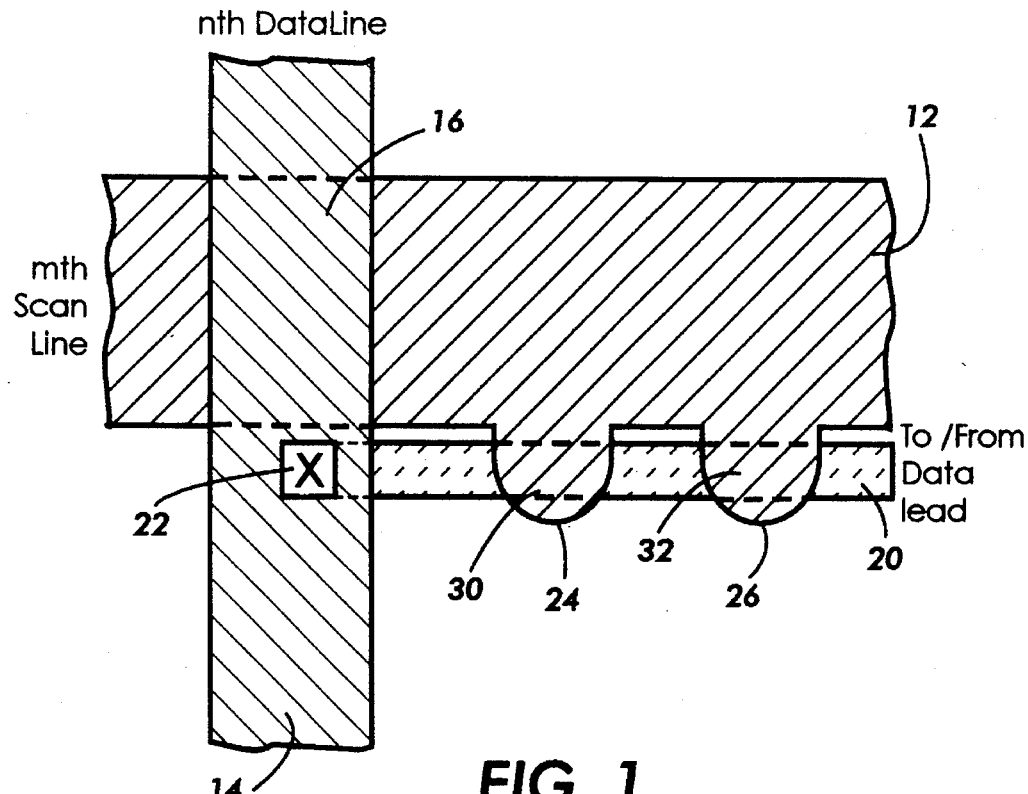
FIG. 1 is a schematic layout diagram showing prior art cell circuitry in which a metal or polysilicon scan line has laterally extending gate lines that cross channels in a semiconductor line.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the second signal includes information from the first signal. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. Two components could be electrically connected even though they are not physically connected, such as through a capacitive coupling.

A "substrate" or "chip" is a unit of material that has a surface at which circuitry can be formed or mounted. An "insulating substrate" is a substrate through which no electric current can flow.

A "layer" is a thickness of material formed over a surface and extending generally parallel to the surface, with one side toward the surface and another side away from the surface. A layer may include two or more layers within it, referred to as "sublayers." A layer may be homogeneous or its composition may vary.

To "etch" is to remove parts of one or more layers of material.

An "etchant" is a fluid used to etch.

To perform "physical vapor deposition" is to cause a material to be deposited on a physical structure without a chemical reaction. Examples include sputtering, vacuum evaporation and e-beam deposition.

To perform "chemical vapor deposition" is to cause a material to be deposited on a physical structure by use of reactant gases and an energy source to produce a gas-phase chemical reaction. The energy source could be thermal, optical, or plasma in nature; "plasma enhanced chemical vapor deposition" uses a plasma energy source.

An operation "deposits" a layer by depositing material to form the layer, such as by physical or chemical vapor deposition.

To perform "lithography" is to use a radiation source to transfer a mask pattern to a layer of radiation-sensitive material and then to develop the radiation-sensitive material to obtain a positive or negative copy of the mask pattern. The transferred pattern that results from development may be referred to as a "pattern of mask material" if it is to be used for etching.

An "electric circuit" is a circuit within which components are electrically connected. An "electric structure" is a physical structure that includes one or more electric circuits.

A "thin-film structure" is an electric structure that is formed at a surface of an insulating substrate. A thin-film structure could be formed, for example, by deposition and patterned etching of films on the insulating substrate's surface.

During production of an electric structure at a surface, a part of a first layer "covers" or "has a shape that covers" or "is over" a part of a second layer if the part of the second layer is between the part of the first layer and the surface. Similarly, a part of a first layer "extends across" a part of a second layer if the part of the first layer covers the part of the second layer.

An "integrated circuit" is a circuit formed at a substrate's surface by batch processes such as deposition, lithography, etching, oxidation, diffusion, implantation, annealing, and so forth.

A "lead" is a part of a component at which the component is electrically connected to other components. A "line" is a simple component that extends between and electrically connects two or more leads. A line is "connected between" the components or leads it electrically connects. A lead of a component is "connected" to a lead of another component when the two leads are electrically connected by a combination of leads and lines. In an integrated circuit, leads of two components may also be "connected" by being formed as a single lead that is part of both components.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals that determine or indicate its state. Lines in the other direction may be "scan lines" through which a cell receives a signal enabling it to receive signals from or provide signals to its data line.

In an array of circuitry, "cell circuitry" is circuitry connected to a cell's scan line and data line.

A "crossing region" is a region in which two lines cross, such as a scan line and a data line.

An "insulating layer" is a layer formed of a non-conductive material.

A part of a layer "has an edge" if another, complementary part of the layer has been removed by one or more processes, leaving the part of the layer. The edge is the boundary between part of a layer and its complementary part. A "width" of a part of a layer such as a line is a distance between two edges.

Edges of two layers or parts of layers in a thin-film structure are "approximately aligned" if their projections onto the surface of the substrate at which the thin-film structure is formed are approximately the same.

Edges of two layers or parts of layers are "slightly offset" from each other if their projections onto the surface of the substrate are at slightly different positions.

A component in one layer is "between" edges in another layer if the projection of the component onto the surface of the substrate is between the projections of the edges.

A "connected shape" in a thin-film structure formed at a surface of a substrate is a part of the structure that is formed from a layer and is bounded by an edge that extends between a first side toward the surface and a second side away from the surface.

A "channel" is a part of a component through which electric current can flow. A channel is "conductive" when the channel is in a state in which current can flow through it.

A line "includes" a channel when a part of the line is the channel.

Two channels in a line are "in series" with each other if both must be conductive for the line to be conductive.

A "channel lead" is a lead that connects to a channel. A channel may, for example, extend between two channel leads.

A "channel region" is a region of an electric structure in which a channel occurs.

A "charge carrier" is a real or fictitious particle that can transport charge through a channel to produce a current; electrons and holes are examples of charge carriers. A "charge carrier source" is an ion, atom, molecule, or other feature of a channel that can provide a charge carrier. A "charge carrier destination" is an ion, atom, molecule, or other feature of a channel that can neutralize or stop movement of a charge carrier. In an integrated circuit, an "n-channel" is a channel for which the majority of charge carrier sources provide charge carriers of negative sign such as electrons; a "p-channel" is a channel for which the majority of charge carrier sources provide charge carriers of positive sign such as holes.

Charge carrier sources and destinations are "positioned" so that an event occurs if the densities, types, or other characteristics of the sources and destinations vary with position in a way that causes the event to occur.

A "dopant" is an ion, atom, molecule, or other particle that can be added to a channel or other part of an integrated circuit during production and that serves as a charge carrier source when the integrated circuit is in use. An "n-type dopant" provides charge carriers of negative sign and a "p-type dopant" provides charge carriers of positive sign.

A process "implants" a dopant if the process causes particles of the dopant to enter a part of an integrated circuit.

A dopant "dopes" a part of a layer if the dopant is implanted in the part. A line is "doped" if it contains an implanted dopant.

An operation "forms" an electrical connection by producing an electrical structure through which current can flow between components. Deposition can form an electrical connection by producing a metal/semiconductor interface or a conductive metal line. Doping can form an electrical connection by producing a doped semiconductor line.

A "transistor" is a component that has a channel that extends between two channel leads, and that also has a third lead-referred to as a "gate lead" or simply "gate"—such that the channel can be switched between high impedance and low impedance by signals that change potential difference between the gate and one of the channel leads, referred to as the "source." The channel lead that is not the source is referred to as the "drain." Other components may have leads called gates, sources, and drains by analogy to transistors.

Signals on a line "control conductivity" of a channel if the signals can change conductivity of the channel. Such a line may be called a "gate line" and the signals may be called "gate signals."

Two components are electrically connected "under control of" a line if a signal on the line can change conductivity of another line connecting the two components. For example, a line that includes a channel can electrically connect two components under control of a gate line.

A "thin-film transistor" or "TFT" is a transistor that is part of a thin film structure.

A "capacitive element" is a component that stores a voltage level by storing charge. A capacitive element may include two conductive components, called "electrodes," separated by an insulating layer.

In a 2D array of circuitry, a cell's area may include a "cell electrode." A cell electrode may serve as one electrode of a capacitor whose other electrode is external to the array.

An "image" is a pattern of physical light.

An "image output device" is a device that can provide output defining an image.

A "display" is an image output device that provides information in a visible form.

A "liquid crystal cell" is an enclosure containing a liquid crystal material.

A "liquid crystal display" or "LCD" is a display that includes a liquid crystal cell with a light transmission characteristic that can be controlled in parts of the cell by an array of light control units to cause presentation of an image.

An "active matrix liquid crystal display" or "AMLCD" is a liquid crystal display that includes a liquid crystal cell and an array of cell circuitry that can cause presentation of an image by the liquid crystal cell.

B. Prior Art Techniques

Figure 2:
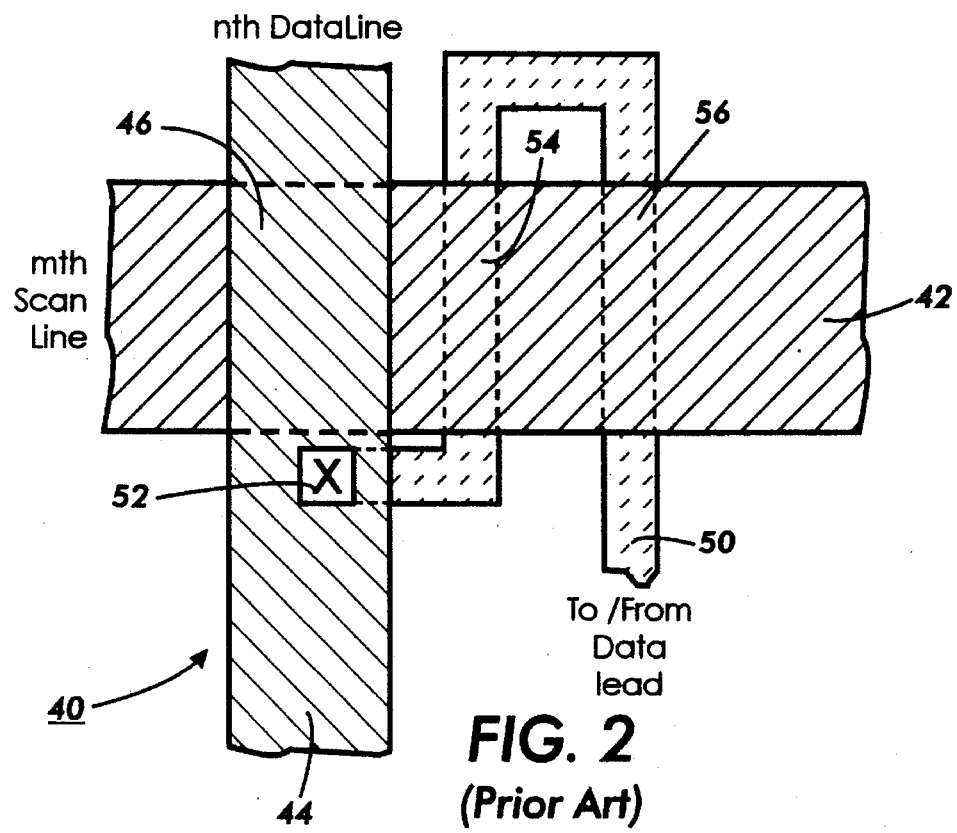
FIG. 2 is a schematic layout diagram showing prior art cell circuitry in which a metal or polysilicon scan line crosses channels in a crooked semiconductor line.

FIGS. 1 and 2 show conventional cell circuitry layouts. In FIG. 1, a scan line has laterally extending gate lines that cross channels in a semiconductor line. In FIG. 2, a scan line crosses channels in a crooked semiconductor line.

Circuitry 10 in FIG. 1 is illustratively from an array that includes M scan lines and N data lines. Mth scan line 12 and nth data line 14 cross in crossing region 16. Cell circuitry connected to mth scan line 12 and nth data line 14 includes semiconductor line 20 with connection 22 to nth data line 14.

Gate lines 24 and 26 extend laterally from mth scan line 12, crossing channels 30 and 32 in semiconductor line 20. As a result, a gate signal on mth scan line 12 controls conductivity in channels 30 and 32, enabling semiconductor line 20 to provide signals from mth data line 14 to a data lead of a component in the cell circuitry or from the data lead to nth data line 14.

Circuitry 40 in FIG. 2 is illustratively from a similar array as FIG. 1, with mth scan line 42 and nth data line 44 cross in crossing region 46. Cell circuitry connected to mth scan line 42 and nth data line 44 includes crooked semiconductor line 50 with connection 52 to nth data line 44.

Because of the crook shape of semiconductor line 50, mth scan line 42 crosses channels 54 and 56. As a result, a gate signal on mth scan line 42 controls conductivity in channels 54 and 56, enabling semiconductor line 50 to provide signals from nth data line 44 to a data lead of a component in the cell circuitry or from the data lead to nth data line 44.

C. General Features of the Invention

Figure 3:
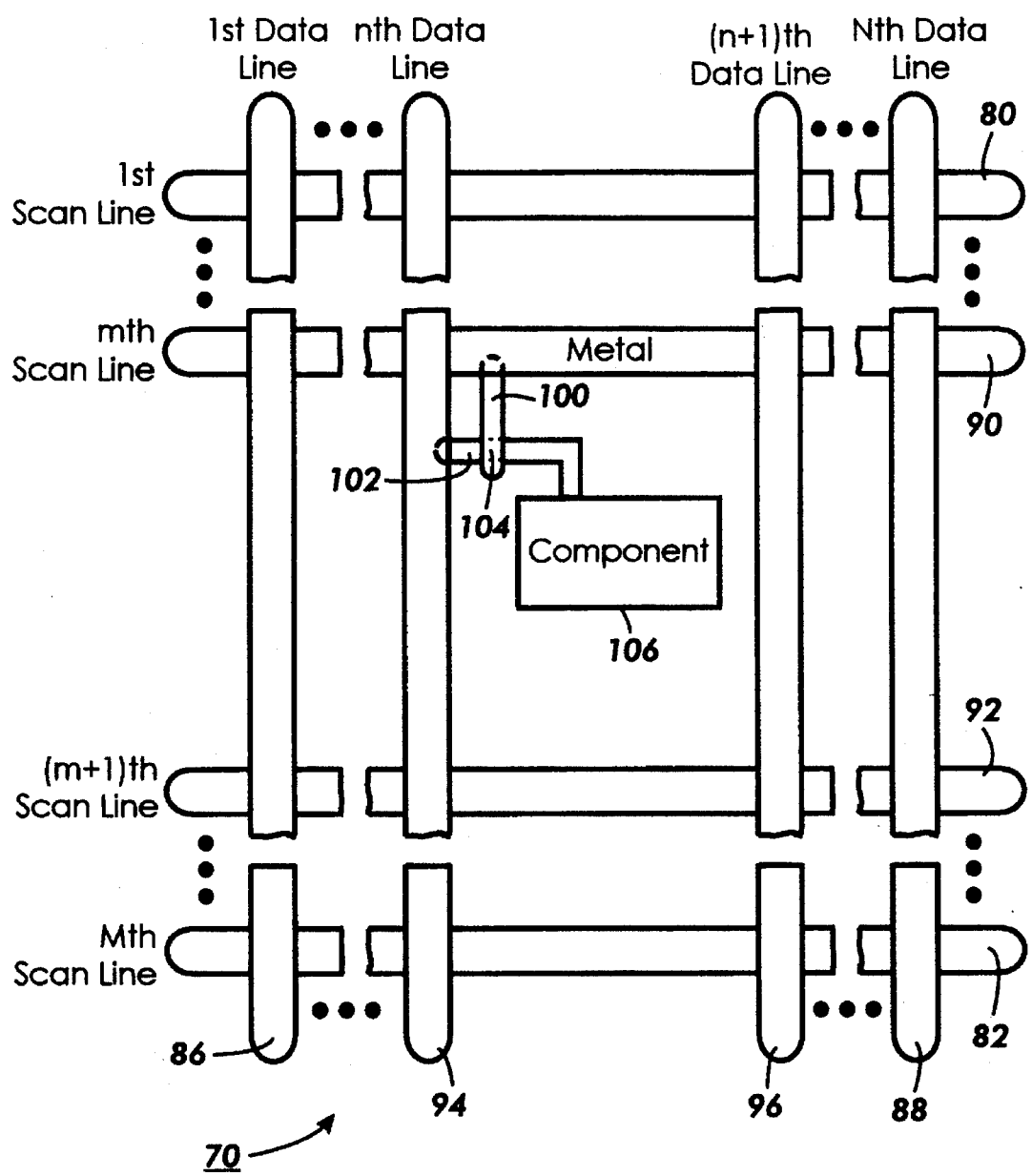
FIG. 3 is a schematic layout diagram showing cell circuitry with a metal scan line and a semiconductor line to control conductivity of channels in a semiconductor line.
Figure 4:
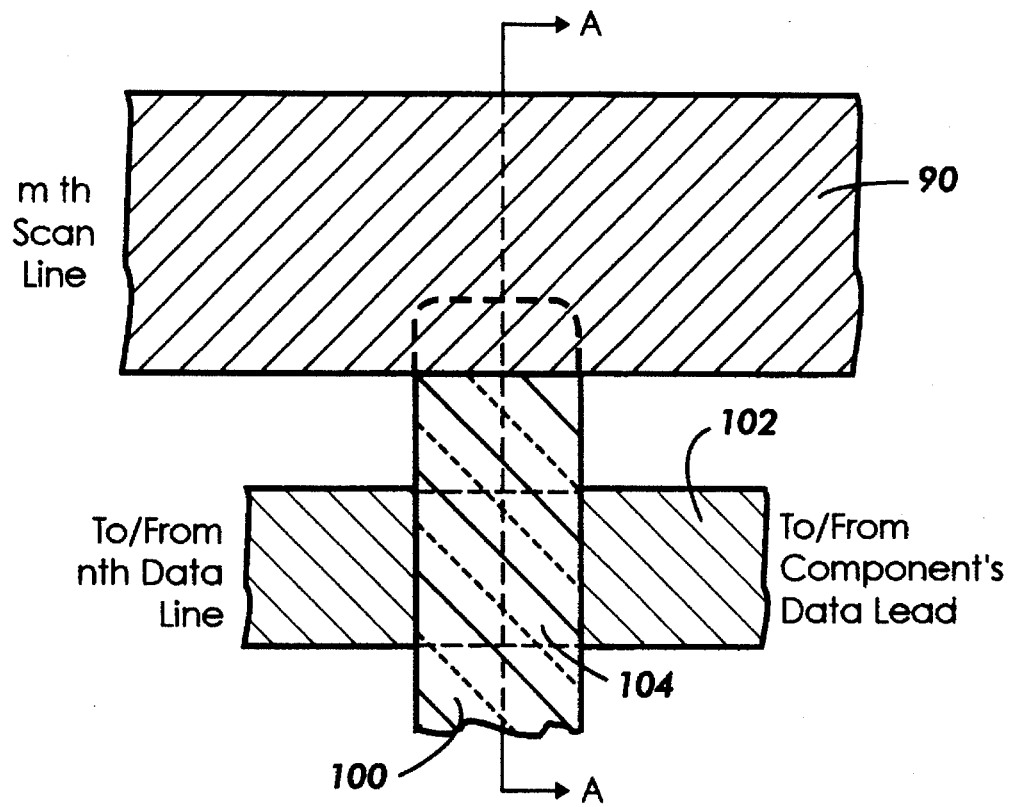
FIG. 4 is a more detailed layout diagram showing the metal scan line and semiconductor line in FIG. 3.
Figure 5:
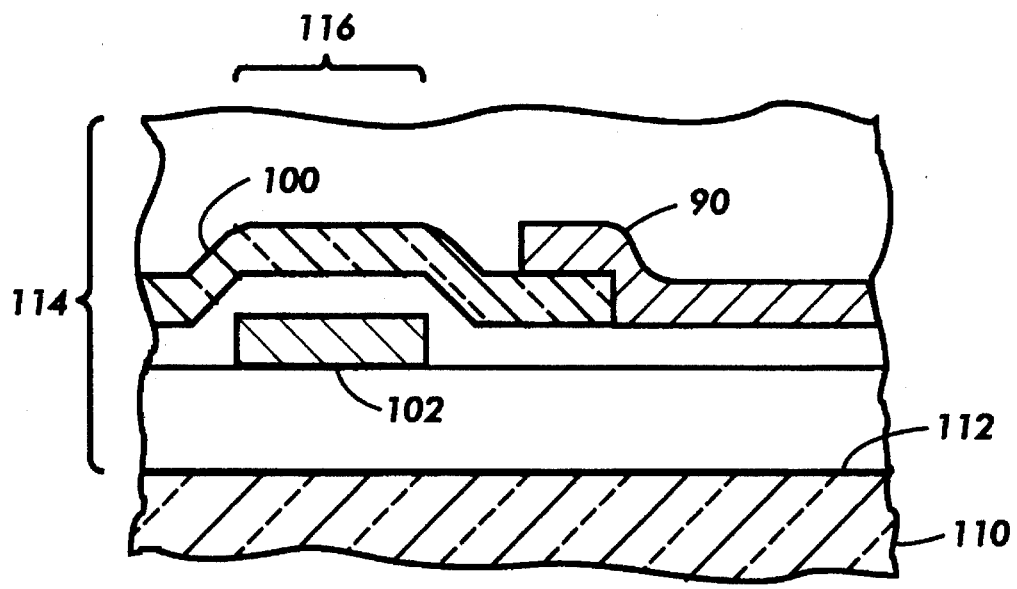
FIG. 5 is a schematic cross section along line A—A in FIG. 4.

FIGS. 3–5 show general features of the invention. FIG. 3 shows schematically an M×N array in which a cell's circuitry includes a semiconductor line that is connected to a metal scan line and that crosses another semiconductor line at a channel between connections to a data line and a data lead. FIG. 4 shows a more detailed schematic layout of a part of the array of FIG. 3. FIG. 5 shows a cross section of FIG. 4 along line A—A.

Array 70 in FIG. 3 includes M scan lines, from first scan line 80 through Mth scan line 82, and N data lines, from first data line 86 through Nth data line 88. Cell circuitry connected to mth scan line 90 and nth data line 92 is illustratively shown in more detail, in the cell area bounded by mth scan line 90, nth data line 92, (n+1)th scan line 94, and (n+1)th data line 96.

As shown in FIG. 3, mth scan line 90 includes metal, but is connected to conductive semiconductor line 100 which crosses semiconductor line 102 at channel 104. Semiconductor line 102 is connected between nth data line 92 and a data lead of component 106. Because semiconductor line 100 is conductive, signals on mth scan line 90 control conductivity of channel 104.

FIG. 4 shows mth scan line 90 and semiconductor lines 100 and 102 in more detail. In the illustrated detail, mth scan line 90 is over semiconductor line 100 and semiconductor line 102 is over channel 104 in semiconductor line 102.

FIG. 5 shows a cross section of FIG. 4 along line A—A. As shown, substrate 110 has surface 112 at which circuitry 114 is formed. Circuitry 114 may include one or more layers below semiconductor line 102, and may also include one or more layers between semiconductor line 102 and semiconductor line 100, such as an insulating layer. Conductive semiconductor line 100 and mth scan line 90 are shown in direct electrical contact through a metal/semiconductor interface, so that semiconductor line 100 conducts signals from mth scan line 90 to channel region 116, controlling conductivity of channel 104. Circuitry 114 may also include one or more layers over mth scan line 90.

D. Implementation

The general features described above could be implemented in numerous ways in various arrays. An implementation described below employs poly-Si TFTs, and is suitable for an AMLCD array.

D.1. Cell Circuitry

Figure 6:
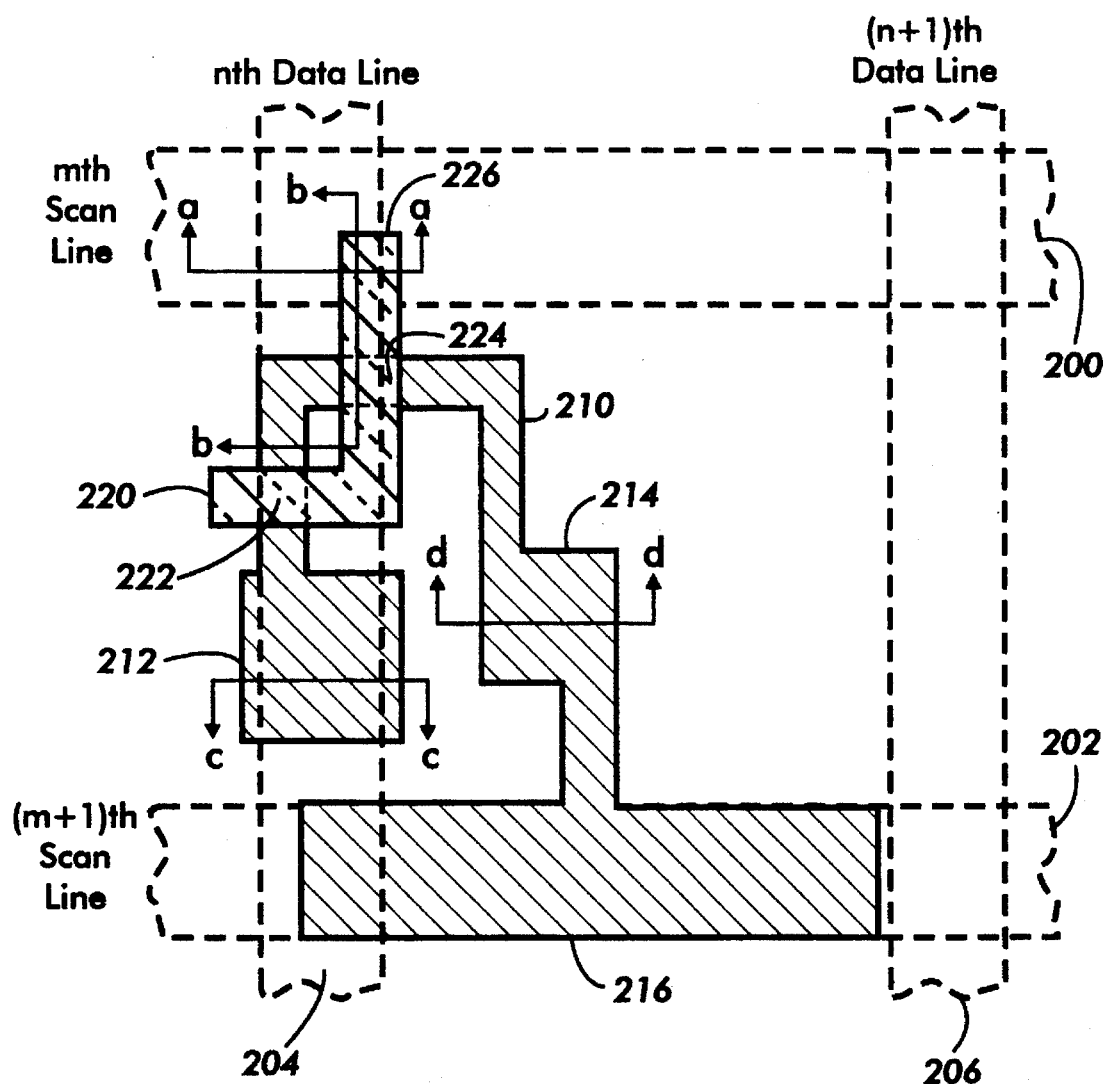
FIG. 6 is a schematic layout diagram showing semiconductor layers in a cell's circuitry.

FIGS. 6–10 illustrate cell circuitry. FIG. 6 shows a layout of first and second semiconductor layers. FIGS. 7–10 show representative cross sections of cell circuitry in FIG. 6, along lines a—a, b—b, c—c, and d—d, respectively.

FIG. 6 shows a part of an M×N array, with mth scan line 200, (m+1)th scan line 202, nth data line 204, and (n+1)th data line 206 in dashed lines. FIG. 6 also shows part of the cell circuitry for the cell that is connected to mth scan line 200 and nth data line 204.

The cell's circuitry includes first semiconductor pattern 210, with a line that extends from first connecting point 212 to second connecting point 214 and with another line extending from second connecting point 214 to capacitor electrode 216. First connecting point 212 is substantially all within the edges of nth data line 204, to which it is electrically connected. The edges of capacitor electrode 216 are aligned with the edges of (m+1)th scan line 202, forming a capacitive element.

The cell's circuitry also includes second semiconductor pattern 220, a line that crosses first semiconductor pattern 210 at channels 222 and 224. Second semiconductor pattern 220 extends from end 226, at which it is electrically connected to mth scan line 200.

The layout in FIG. 6 is designed to have the following dimensions when implemented with poly-Si TFTs on an insulating substrate: Each cell is 30 μm×30 μm, of which the scan line occupies 6 μm and the data line occupies 5 μm. The lines in first semiconductor pattern 210 are 2 μm wide, and second semiconductor pattern 220 is 2.5 μm wide. In general, the smallest features are 2 μm and the smallest separations are 3 μm, with 1.0 μm overlay and an aperture ratio of 49.7%.

The cell circuitry in FIG. 6 is designed so that the capacitive element formed by (m+1)th scan line 202 and capacitor electrode 216 has sufficient capacitance that stored voltages are not significantly affected by capacitive coupling with data line voltage fluctuations. Dark matrix is used to improve image quality by blocking stray illumination, as at edges, with minimum sacrifice of aperture.

Figure 7:
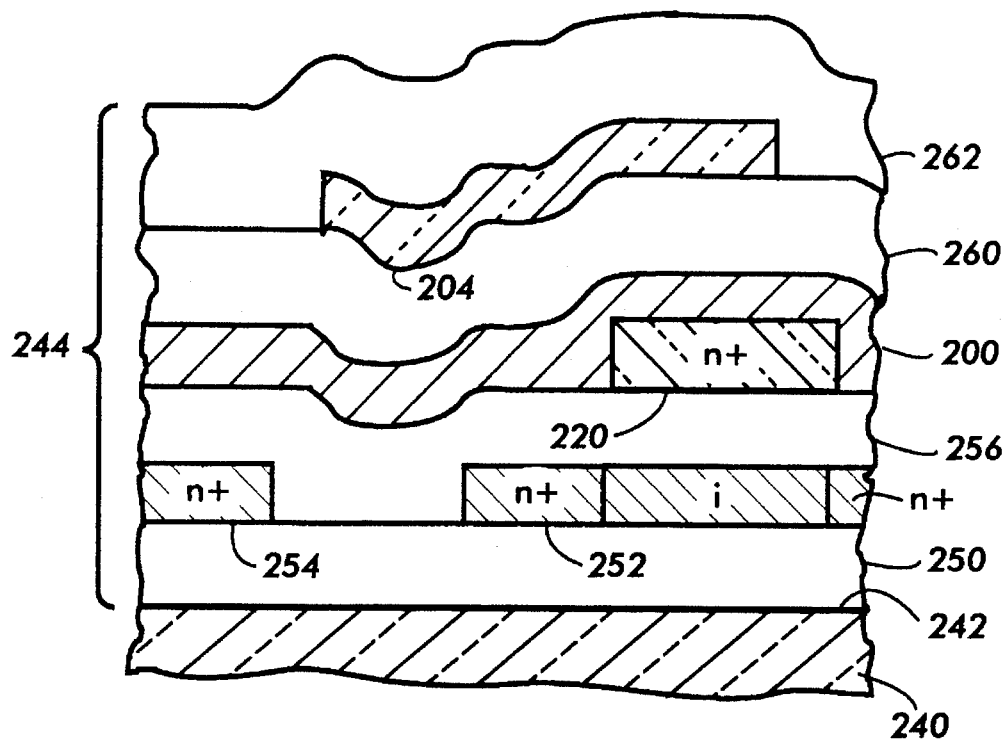
FIG. 7 is a schematic cross section along line a—a in FIG. 6.

FIG. 7 shows substrate 240, which can be quartz, with surface 242 at which circuitry 244 is formed. Circuitry 244 includes insulating layer 250 on surface 242, on which capacitor electrodes 252 and 254 are formed for the cell circuitry connected to the (m−1)th scan line and to the nth and (n−1)th data lines respectively. Capacitor electrodes 252 and 254 each include heavily n-doped poly-Si, as indicated by "n +," except that a small area of electrode 252 that is under second semiconductor pattern 220 is undoped, intrinsic poly-Si, as indicated by "i." If the area in which second semiconductor pattern 220 overlaps capacitor electrode 252 is small, as in FIG. 6, this small undoped area has an insignificant effect on capacitance.

Circuitry 244 also includes insulating layer 256 between capacitor electrodes 252 and 254 and second semiconductor pattern 220 shown in FIG. 6. Second semiconductor pattern 220 also includes heavily n-doped poly-Si, and is electrically connected to mth scan line 200, which includes aluminum, and which can be implemented as a hybrid TiW/AlCu stack. Because of the small overlap with second semiconductor pattern 220 and because of a slight dip between capacitor electrodes 252 and 254, mth scan line has slight variations in cross section, but in general its cross section remains substantially uniform across the array.

Circuitry 244 then includes insulating layer 260 separating mth scan line 200 from nth data line 204, which can also be implemented as a hybrid TiW/AlCu stack. Over nth data line 204 is passivation layer 262 of polyimide.

Figure 8:
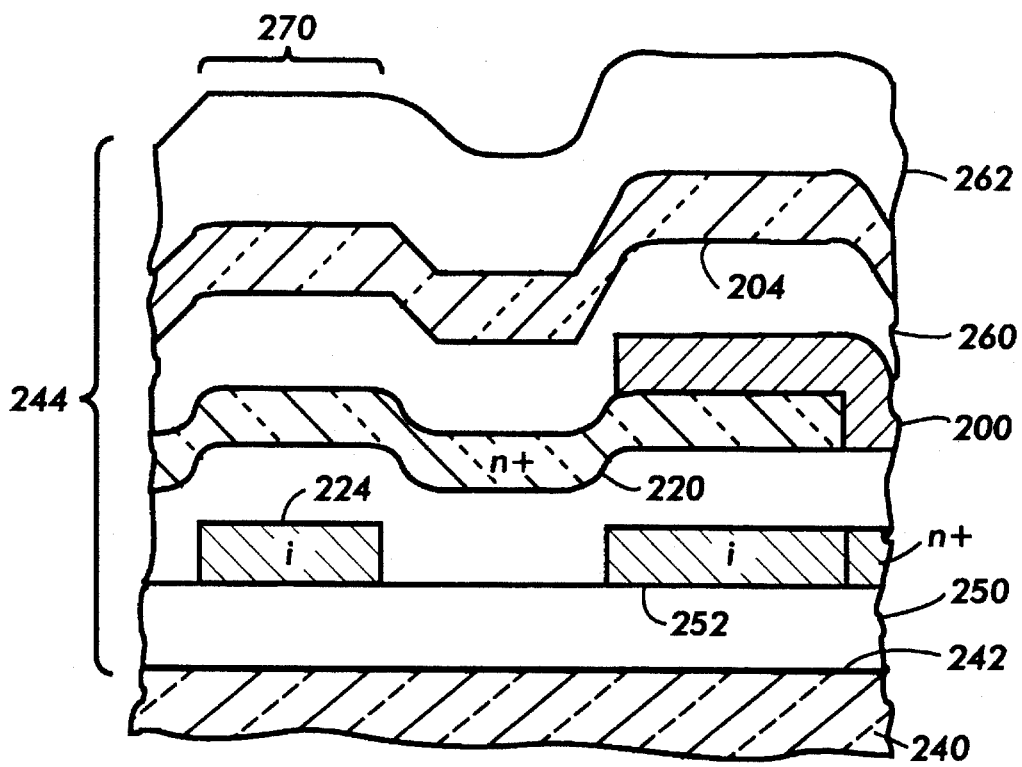
FIG. 8 is a schematic cross section along line b—b in FIG. 6.

FIG. 8 shows a different cross section of circuitry 244, with many of the same features as FIG. 7, but also showing channel 224 in first semiconductor pattern 210. As shown, second semiconductor pattern 220 provides signals from mth scan line 200 to channel region 270, controlling conductivity of channel 224.

Figure 9:
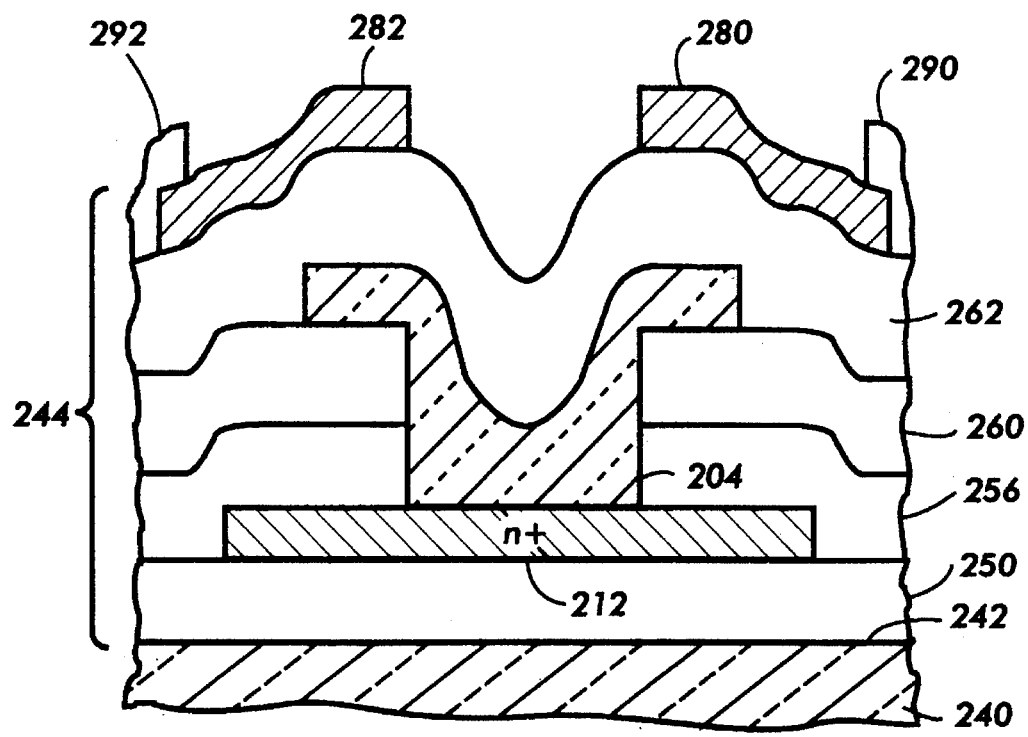
FIG. 9 is a schematic cross section along line c—c in FIG. 6.

FIG. 9 shows a cross section through first connecting point 212. As shown, nth data line 204 forms a metal/semiconductor contact with first semiconductor pattern 210 through an opening in insulating layers 256 and 260. Dark matrix lines 280 and 282 are formed on passivation layer 262 over the edges of nth data line 204, and indium tin oxide (ITO) pixel electrodes 290 and 292 slightly overlap dark matrix lines 280 and 282.

Figure 10:
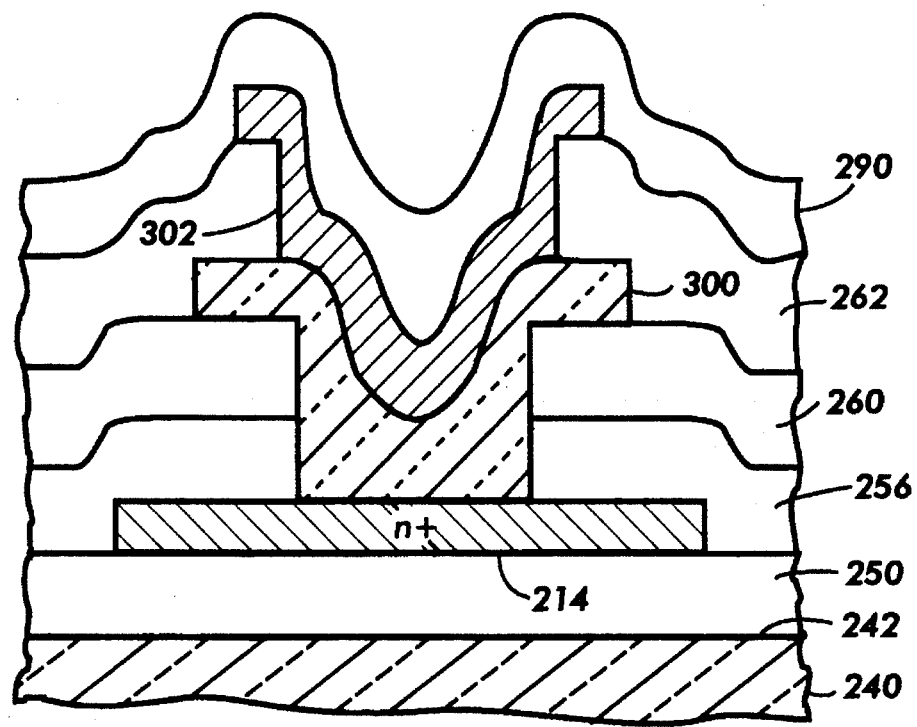
FIG. 10 is a schematic cross section along line d—d in FIG. 6.

FIG. 10 shows a cross section through second connecting point 214. Metal pattern 300 forms a metal/semiconductor contact with first semiconductor pattern 210 through an opening in insulating layers 256 and 260. Metal pattern 300 can be formed from the same metal layer as nth data line 204. Conductive dark matrix pattern 302 can be formed from the same material as dark matrix lines 280 and 282 in FIG. 9. ITO pixel electrode 290 then forms an electrical connection with second connecting point 214 through metal pattern 300 and dark matrix pattern 302. Although metal pattern 300 blocks stray illumination at the edges of insulating layers 256 and 260 and smooths the topology, dark matrix pattern 302 provides process compatibility between ITO pixel electrode 290 and metal pattern 300.

D.2. Fabrication

Figure 11:
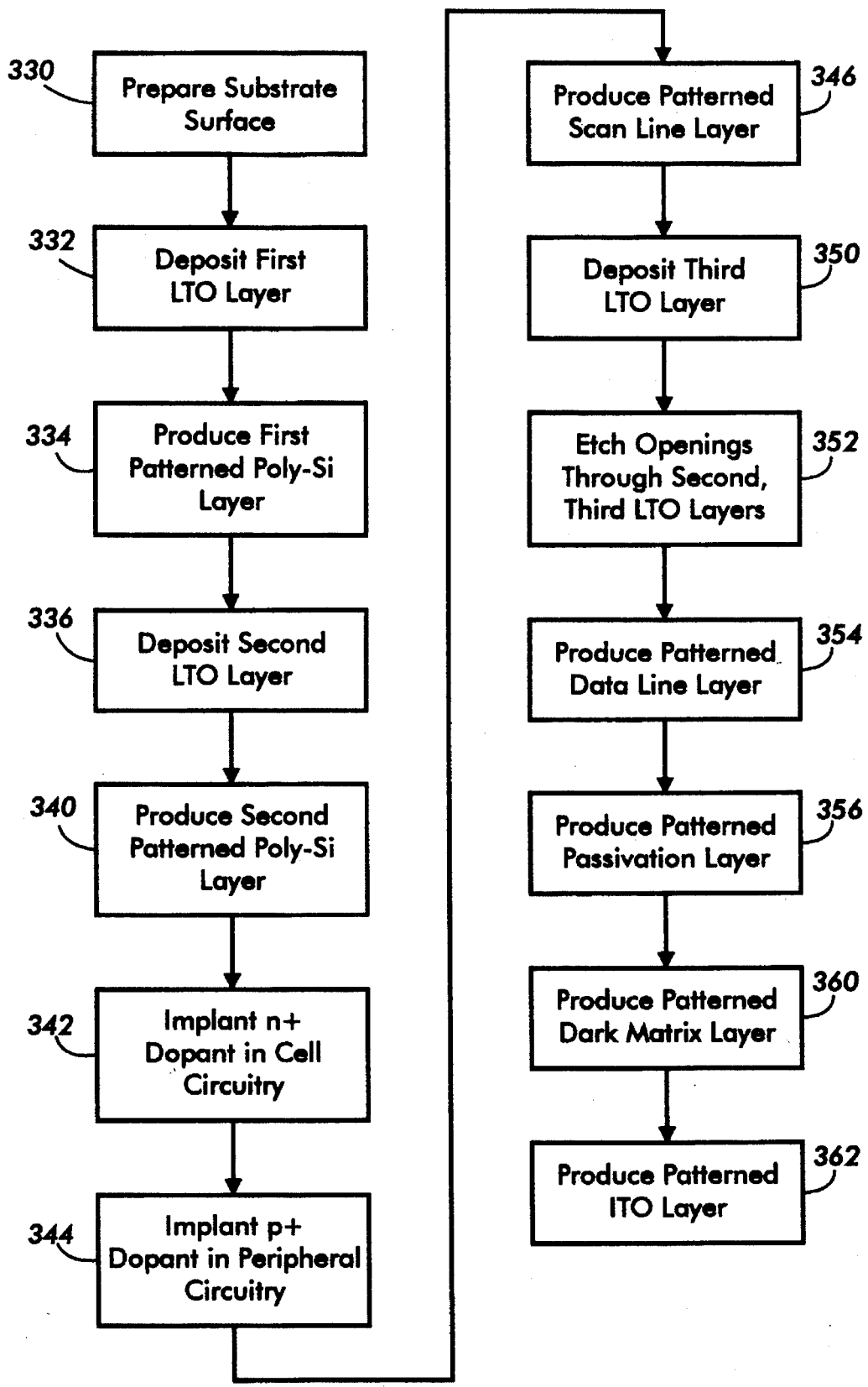
FIG. 11 is a flow chart showing acts in producing cell circuitry as in FIG. 6.

FIG. 11 shows acts in producing cell circuitry as described above.

The act in box 330 begins by preparing a surface of a quartz substrate. The act in box 330 can include any necessary cleaning.

The act in box 332 then deposits a first layer of low temperature oxide (LTO), which can be $SiO_2$ deposited with plasma chemical vapor deposition. The first LTO layer can be deposited to a thickness of 0.7 µm and then annealed.

The act in box 334 deposits a layer of a-Si to a thickness of 0.1 µm, then performs Si self-ion implantation to enhance performance. The act in box 334 also performs crystallization and annealing at 600° C. As a result, the a-Si becomes poly-Si. The act in box 334 performs lithography to produce a pattern of mask material that covers the parts of the poly-Si that form first semiconductor pattern 210. Then, the act in box 334 etches to remove areas not covered by the pattern of mask material, leaving first semiconductor pattern 210.

The act in box 336 deposits a second layer of LTO to a thickness of 0.085 µm. The act in box 336 also performs oxidation at 950° C. under 150 atmospheres and anneals the second LTO layer.

The act in box 340 deposits a layer of poly-Si to a thickness of 0.35 µm. The act in box 340 performs lithography to produce a pattern of mask material that covers the parts of the poly-Si that form second semiconductor pattern 220 or another similar pattern that crosses the first semiconductor pattern at one or two channels. Then, the act in box 340 etches to remove areas not covered by the pattern of mask material, leaving second semiconductor pattern 220. Then, the act in box 340 removes the mask material.

The act in box 342 performs lithography to produce a pattern of mask material that does not cover the cell circuitry, but may, for example, cover areas in which peripheral circuitry is being formed on the substrate. The act in box 342 then implants a heavy concentration of an n-type dopant, making second semiconductor pattern 220 conductive and forming conductive leads in first semiconductor pattern 210. Then, the act in box 342 removes the mask material by an appropriate plasma resist etching.

The act in box 344 similarly performs lithography to produce a pattern of mask material that does not cover the peripheral circuitry, but covers the cell circuitry. The act in box 344 then implants a heavy concentration of a p-type dopant to form conductive areas in the peripheral circuitry. Then, the act in box 344 removes the mask material. The act in box 344 can also perform crystallization annealing at 600° C.

Because they implant heavy concentrations of dopants, the acts in boxes 342 and 344 may employ any of a number of implantation processes, including non-mass selection processes such as ion showering, plasma extraction, ion bucket, and so forth.

The act in box 346 deposits a layer of metal to a thickness of 0.1–0.2 µm to produce a scan line layer. The scan line layer can, for example, be a hybrid TiW/AlCu multilayer stack with three or four layers of 0.01 µm of TiW separated by two or three layers of 0.05 of AlCu, similar to the multilayer metal lines described in copending, coassigned U.S. patent application Ser. No. 08/234,897, entitled "Hillock-Free Multilayer Metal Lines for High Performance Thin Film Structures," incorporated herein by reference. The hybrid films can be sputtered or evaporated using two alloy targets, alternating between the targets. These thicknesses avoid hillock formation in the AlCu layers during processing, yet provide a thin barrier metal to avoid intermixing between the AlCu layers or between an AlCu layer and other layers, avoiding hillock formation, film bubbling, peeling, or spiking into a poly-Si layer, for example. The films can all be wet etched at approximately the same rate to achieve a high degree of dimension control. The ratio of the wet TiW etchant to the wet AlCu etchant can be approximately 50:1; in contrast to the standard Al etchant, this mixed etchant is much lower in viscosity and less violent during etching, removing bubbling.

The act in box 346 then performs lithography to produce a pattern of mask material that covers the parts of the scan line layer that form the scan lines. Then, the act in box 346 etches to remove areas not covered by the pattern of mask material, leaving the scan lines. Then, the act in box 346 removes the mask material.

The act in box 350 deposits a third layer of LTO to a thickness of 0.7 µm. The act in box 350 also performs hydrogenation to passivate the channels in first semiconductor pattern 210 and an appropriate wet oxide etch to remove the damaged layer resulting from the hydrogenation process. This hydrogenation does not cause degradation of channels in first semiconductor pattern 210 because the scan lines formed in box 346 are not over the channels in first semiconductor pattern 210.

The act in box 352 performs lithography to produce a pattern of mask material that does not cover first and second connection points 212 and 214 and any other areas in which metal in the data line layer contacts the layer formed in box 334, but covers all other areas. The act in box 352 then etches to form openings in the second and third LTO layers from boxes 336 and 350 in the areas that are not covered. Then, the act in box 352 removes the mask material.

The act in box 354 deposits a data metal layer to a thickness of 0.5 µm. The data metal layer can, for example, be a hybrid TiW/AlCu multilayer stack as described above. The act in box 354 then performs lithography to produce a pattern of mask material that covers the parts of the data line layer that form the data lines and that cover the opening to second connection point 214. Them the act in box 354 etches to remove areas not covered by the pattern of mask material, leaving the data lines. Then, the act in box 354 removes the mask material.

The data line layer over second connection point 214 blocks light leakage due to poor liquid crystal control as a result of the steepness of the topology. This light leakage blocking raises contrast ratio dramatically.

The act in box 356 deposits a passivation layer of polyimide to a thickness of 1.5 μm. The act in box 356 performs lithography to produce a pattern of mask material that does not cover second connection point 214 and any other areas in which metal in the data line layer should be exposed for contact. The act in box 356 then etches to form openings in the passivation layer in the areas that are not covered. Then, the act in box 356 removes the mask material.

The passivation layer also acts to planarize the surface, and spin-on glass could be used instead of polyimide. Planarization is important because of the steepness of the topology.

The act in box 360 deposits a dark matrix layer of TiW to a thickness of 0.1 μm. TiW is advantageous as a dark matrix material because it acts as a mutual etch stop with indium-tin-oxide (ITO) and aluminum and has a high optical density even in a thin layer, and it is advantageously applied over the circuitry rather than on a cover sheet. The act in box 360 performs lithography to produce a pattern of mask material that covers the dark matrix layer only in areas in which light shielding is needed, such as along the edges of each data line and around second connection point 214. The act in box 360 then etches to remove the areas that are not covered. Then, the act in box 360 removes the mask material.

The act in box 362 deposits ITO to a thickness of 0.055 μm. The act in box 362 performs lithography to produce a pattern of mask material that covers the ITO layer in light transmissive cell areas. The act in box 362 then etches to remove the areas that are not covered. Then, the act in box 362 removes the mask material and anneals the ITO layer at 280° C.

D.3. Display

Figure 12:
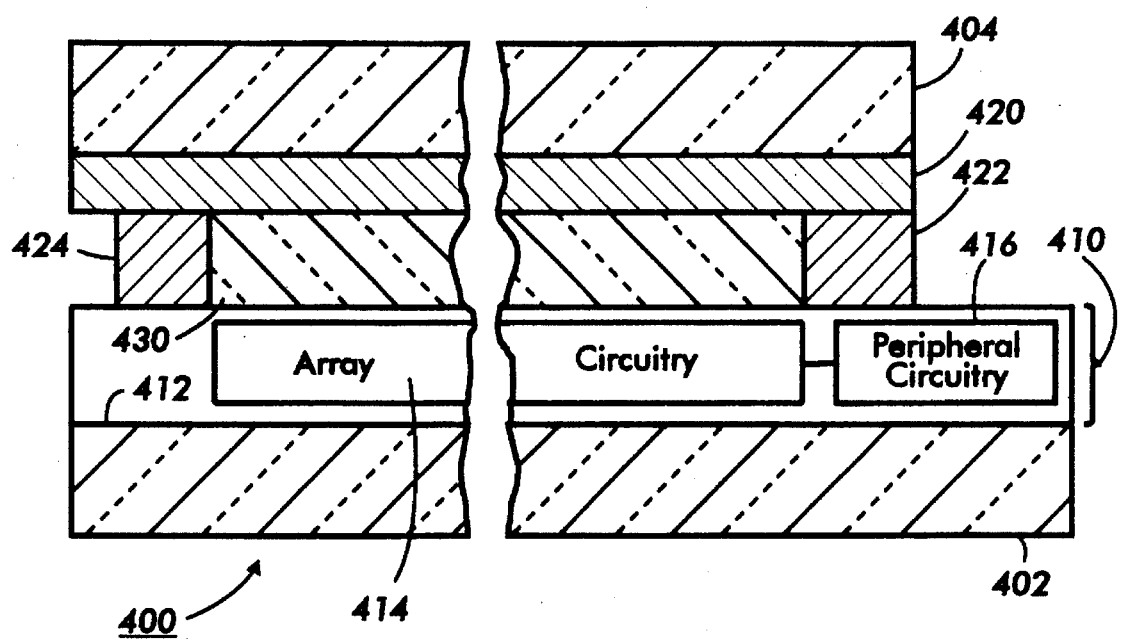
FIG. 12 is a cross section of a display that includes an array produced as shown in FIG. 11.

FIG. 12 shows features of a display that includes circuitry produced as described above.

Display 400 in FIG. 12 includes array substrate 402 and cover substrate 404. Array substrate 402 is quartz, but cover substrate 404 could be quartz or glass.

Circuitry 410 formed at surface 412 of array substrate 402 includes array circuitry 414 and peripheral circuitry 416. Peripheral circuitry 416 is outside the boundary of array circuitry 414, and can include drivers connected to the ends of scan lines and data lines. As described above, array circuitry 414 can have n-doped poly-Si TFTs, while peripheral circuitry 416 can have p-doped poly-Si TFTs.

ITO layer 420 is formed at a surface of cover substrate 404 and faces surface 412 of array substrate 402, separated by spacers 422 and 424 at the boundary of array circuitry 414. If display 400 is a projection device, it should be small enough that no other spacers are needed within the boundary of array circuitry 414, because spacers can cause image problems in a projection display. The need for spacers can be reduced by using thicker substrates and by assembling at lower temperatures.

Display 400 also includes liquid crystal material 430 in the cavity defined by ITO layer 420, array circuitry 414, and spacers 422 and 424. Liquid crystal material 430 can be a 90° twisted nematic liquid crystal.

Display 400 could, for example, be a wafer-scale projection display of approximately 1.5" diagonal. Display 400 could alternatively be a large area direct viewing display.

Display 400 can be assembled using techniques like those described in copending, coassigned U.S. patent application Ser. No. 08/235,011, entitled "Thin-Film Structure with Dense Array of Binary Control Units for Presenting Images," incorporated herein by reference.

D.4. Results

The techniques described above have been simulated and compared with prior art techniques. Simulation results have shown significantly reduced cross talk and improved image quality, in part due to much larger storage capacitance and in part due to smaller gate and parasitic capacitances in the TFTs.

A dummy 30×30 array of cells with no liquid crystal assembly has been manufactured, tested, and found to be fully functional.

1280×1024 arrays have been successfully manufactured, both wafer-scale and large area. The wafer-scale arrays employ conventional 2 μm CMOS technology, while the large area arrays employ conventional 3 μm CMOS technology.

Results to date indicate that the wafer-scale and large area arrays will be fully functional when assembled and that the circuitry is scalable to 1 μm or smaller CMOS technology.

D.5. Variations

The implementation described above provides thin film circuitry on an insulating substrate. The invention could be implemented with other types of circuitry on other types of substrates.

The implementation described above provides circuitry with specific geometric and electric characteristics, but the invention could be implemented with different geometries and with different circuitry.

The implementation described above includes layers of specified thicknesses, produced from specified materials by specified processes, but other thicknesses could be produced, and other materials and processes could be used, such as thinner semiconductor and gate oxide layers to improve TFT performance or to increase storage capacitance. Rather than poly-Si, other semiconductor materials could be used in the semiconductor layers, including but not limited to a-Si, SiGe, CdSe, or a composite layer of poly-Si and SiGe. Similarly, various conductive materials could be used in the scan lines and data lines, including but not limited to ITO, MoTa, Cr, MoCr, Ta, Cu, Ti, TiN, and organic conductive materials.

The implementation described above includes layers in a specific sequence, but the sequence of layers could be modified, such as by producing bottom gate TFT structures.

The implementation described above forms a semiconductor line that is heavily doped except in channels at which it crosses a gate line, but other doping techniques could be used. For example, doping could be lowered to reduce leakage current as described in copending, coassigned U.S. patent application Ser. No. 08/277,719, entitled "Reduced Leakage Current Multiple Gate Thin Film Transistors," incorporated herein by reference.

The implementation described above forms an array with metal scan lines controlling semiconductor gate lines in accordance with the invention described in copending, coassigned U.S. patent application Ser. No. 08/367,983, entitled "Forming Array with Metal Scan Lines to Control Semiconductor Gate Lines," incorporated herein by reference. The invention could, however, be implemented with other techniques.

The implementation described above includes a gate line that crosses a semiconductor line at two channels in accordance with the invention described in copending, coassigned U.S. patent application Ser. No. 08/867,984, entitled "Circuitry with Gate Line Crossing Semiconductor Line at Two or More Channels," incorporated herein by reference. The invention could, however, be implemented with a single channel, or with other multiple gate techniques.

E. Applications

The invention could be applied in many ways, including arrays for displays, sensors, and light valves.

F. Miscellaneous

The invention has been described in relation to thin-film implementations, but the invention might be implemented with single crystal technology.

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. An array comprising:

a substrate with a surface at which circuitry can be formed; and array circuitry formed at the surface of the substrate, the array circuitry comprising:

a set of M scan lines, where M is greater than 1; each of the scan lines extending approximately in a first direction across the surface of the substrate; the M scan lines being positioned in order from first through Mth;

a set of N data lines, where N is greater than 1; each of the data lines extending approximately in a second direction across the surface of the substrate; the second direction being different than the first direction; the N data lines being positioned in order from first through Nth;

for each value of m from 1 through M and for each value of n from 1 through N, a crossing region in which the mth scan line and the nth data line cross;

for each of a set of one or more of the crossing regions, cell circuitry connected to the mth scan line and the nth data line; the cell circuitry of each crossing region in the set comprising:

a component having a data lead for receiving signals from or providing signals to the nth data line; and connecting circuitry for electrically connecting the data lead to the nth data line under control of the mth scan line; the mth scan line comprising metal; the connecting circuitry comprising:

a first semiconductor line connected between the nth data line and the data lead; the first semiconductor line including a first channel; and a second semiconductor line connected to the mth scan line and crossing the first semiconductor line at the first channel;

the second semiconductor line being conductive so that signals on the mth scan line control conductivity of the first channel.

2. The array of claim 1 in which the first and second directions are perpendicular.

3. The array of claim 1 in which the array is a two-dimensional array.

4. The array of claim 1 in which the substrate is an insulating substrate.

5. The array of claim 1 in which the array circuitry comprises a thin-film structure.

6. The array of claim 1 in which the first semiconductor line comprises polysilicon.

7. The array of claim 1 in which the second semiconductor line comprises polysilicon.

8. The array of claim 1 in which the mth scan line comprises aluminum.

9. The array of claim 1 in which the first and second semiconductor lines are separated at the channel by an insulating layer; the insulating layer being an oxide.

10. The array of claim 1 in which the component comprises a capacitive element; the capacitive element comprising:

a first electrode that is part of the (m+1)th scan line;

a second electrode that is between the (m+1)th scan line and the substrate; the second electrode being connected to the data lead; and an insulating layer between the first and second electrodes;

the first electrode extending between crossing regions in which the nth and (n+1)th data lines cross the (m+1)th scan line.

11. The array of claim 10 in which the first electrode has a first width in the second direction between first and second edges; the second electrode having a second width in the second direction between third and fourth edges; the first and second widths being approximately equal; the first and third edges being approximately aligned with each other and the second and fourth edges being approximately aligned with each other.

12. The array of claim 1 in which the mth and (m+1)th scan lines and the nth and (n+1)th data lines bound a cell area; the component comprising a cell electrode in the cell area; the cell electrode being connected to the data lead.

13. The array of claim 12 in which the cell electrode is light transmissive.

14. The array of claim 1 in which the nth data line has a width in the first direction between fifth and sixth edges; the first channel being between the fifth and sixth edges.

15. The array of claim 14 in which the first semiconductor line is between the nth data line and the substrate.

16. The array of claim 14 in which substantially all of the second semiconductor line is between the fifth and sixth edges; the second semiconductor line being connected to the mth scan line in the crossing region.

17. The array of claim 1 in which the first semiconductor line further includes a second channel in series with the first channel; the second semiconductor line further crossing the first semiconductor line at the second channel so that signals on the mth scan line also control conductivity of the second channel.

18. The array of claim 1 in which the set of one or more of the crossing regions includes all of the crossing regions.

19. The array of claim 1 in which the mth scan line's cross section is substantially uniform across the array.

20. A display comprising:

a substrate with a surface at which circuitry can be formed;

array circuitry formed at the surface of the substrate, the array circuitry comprising:

a set of M scan lines, where M is greater than 1; each of the scan lines extending approximately in a first direction across the surface of the substrate; the M scan lines being positioned in order from first through Mth;

a set of N data lines, where N is greater than 1; each of the data lines extending approximately in a second direction across the surface of the substrate; the second direction being perpendicular to the first direction; the N data lines being positioned in order from first through Nth;

for each value of m from 1 through M and for each value of n from 1 through N, a crossing region in which the mth scan line and the nth data line cross;

for each of a set of one or more of the crossing regions, cell circuitry connected to the mth scan line and the nth data line; the cell circuitry of each crossing region in the set comprising:

a component having a data lead for receiving signals from the nth data line; the mth and (m+1)th scan lines and the nth and (n+1)th data lines bounding a cell area; the component comprising a light-transmissive cell electrode in the cell area; the cell electrode being connected for receiving signals from the data lead;

connecting circuitry for electrically connecting the data lead to the nth data line under control of the mth scan line; the mth scan line comprising metal; the connecting circuitry comprising:

a first semiconductor line connected between the nth data line and the data lead; the first semiconductor line including a first channel; and a second semiconductor line connected to the mth scan line and crossing the first semiconductor line at the first channel;

the second semiconductor line being conductive; and a liquid crystal material positioned along the cell electrode so that signals on the mth scan line control light transmissivity of the liquid crystal material by controlling conductivity of the first channel.

21. The display of claim 20 in which the array circuitry has an outer boundary; the scan lines and the data lines extending across the outer boundary; the display further comprising:

peripheral circuitry formed at the surface of the substrate outside the outer boundary of the array circuitry; the peripheral circuitry comprising:
scan circuitry connected to the scan lines; and
data circuitry connected to the data lines.

22. An array comprising:

a substrate with a surface at which circuitry can be formed; and array circuitry formed at the surface of the substrate, the array circuitry comprising:

a set of two or more scan lines, each of the scan lines extending approximately in a first direction across the surface of the substrate;

a set of two or more data lines; each of the data lines extending approximately in a second direction across the surface of the substrate; the second direction being different than the first direction so that each of the scan lines and each of the data lines cross in a crossing region;

for each of a set of one or more of the crossing regions, cell circuitry connected to the scan line and the data line that cross in the crossing region; the cell circuitry of each crossing region in the set comprising:

a component having a data lead for receiving signals from or providing signals to the data line; and connecting circuitry for electrically connecting the data lead to the data line under control of the scan line; the scan line comprising metal; the connecting circuitry comprising:

a first semiconductor line electrically connected between the data line and the data lead; and a second semiconductor line that crosses the first semiconductor line; the first semiconductor line including a channel where the second semiconductor line crosses it; the second semiconductor line being electrically connected to the scan line so that signals on the scan line control conductivity of the channel in the first semiconductor line.

23. The array of claim 22 in which the second semiconductor line is conductive.

* * * * *